Figure 1:
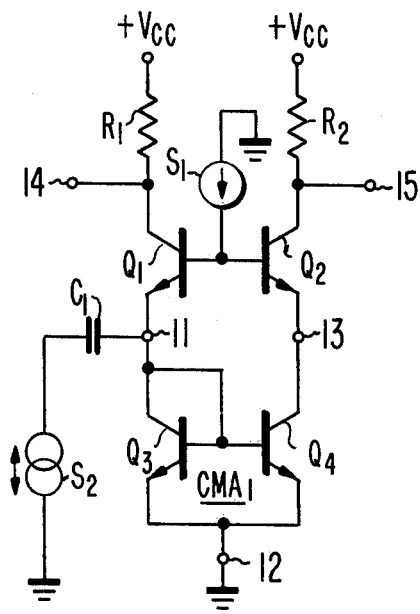

United States Patent [19]

Radovsky

[11] 4,049,977
[45] Sept. 20, 1977

[54] PHASE-SPLITTER
[75] Inventor: Jonathan Samuel Radovsky, Trenton, N.J.
[73] Assignee: RCA Corporation, New York, N.Y.
[21] Appl. No.: 675,258
[22] Filed: Apr. 8, 1976
[51] Int. Cl.² ........................................... H03K 4/00
[52] U.S. Cl. .............................. 307/262; 307/296 R; 330/22
[58] Field of Search ............... 307/296, 297, 260, 262; 330/14, 15, 22, 40

[56] References Cited
U.S. PATENT DOCUMENTS

| 3,840,819 | 10/1974 | Steckler | 330/22 |
| 3,899,744 | 8/1975 | Kominami | 330/40 |
| 3,958,135 | 5/1976 | Rosenthal | 330/14 |
| 3,979,689 | 9/1976 | Schade, Jr. | 330/22 |

Primary Examiner—Stanley D. Miller, Jr.
Assistant Examiner—B. P. Davis
Attorney, Agent, or Firm—H. Christoffersen; S. Cohen; A. L. Limberg

[57] ABSTRACT

First and second transistors are connected at their bases to share a bias current supplied to them from a constant current generator. The emitter electrodes of the first and second transistors are connected respectively to the input terminal and to the output terminal of a current mirror amplifier. Input signal applied to the input terminal of the current mirror amplifier causes push-pull variations in the collector currents of the first and second transistors.

7 Claims, 3 Drawing Figures

PHASE-SPLITTER

The present invention relates to phase-splitters—that is, to circuits providing push-pull output signals responsive to an applied input signal.

In a phase-splitter embodying the present invention first and second transistors are connected at their base electrodes to share a bias current supplied to them from a constant current generator. The emitter electrodes of the first and second transistors are connected respectively to the input terminal and to the output terminal of a current mirror amplifier. Input signal applied to the input terminal of the current mirror amplifier causes pushpull variations in the collector currents of the first and second transistors.

Figure 2:
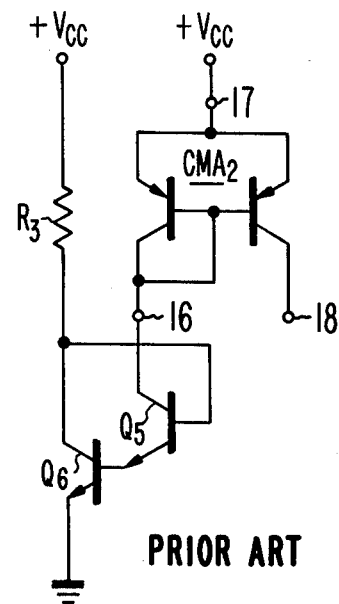
Figure 3:
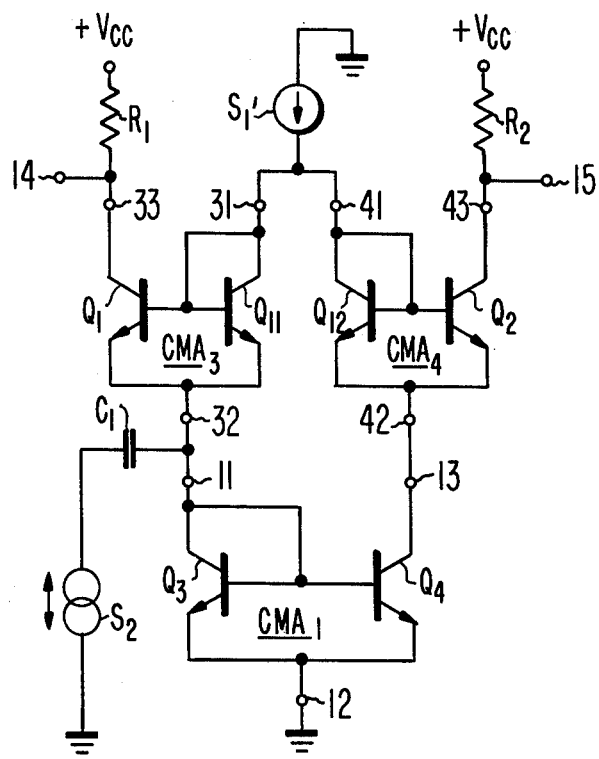

In the drawing:

FIGS. 1 and 3 are schematic diagrams of phase splitters which are representative embodiments of the present invention, and FIG. 2 is a prior art constant current generator useful in combination with the FIG. 1 phase-splitter for biasing it advantageously.

In FIG. 1, a constant current generator $S_1$ supplies a bias current to the joined base electrodes of transistors $Q_1$ and $Q_2$. (The term "constant current generator" as used herein, refers to a circuit whose output current does not change appreciably with variation in the load to which this current in supplied, although this current may vary as a function of other parameters of the generator, such as its temperature or the common-emitter current gain $\beta$ of its transistors.) Transistors $Q_3$ and $Q_4$ are connected as a current mirror amplifier $CMA_1$ having an input terminal 11, a common terminal 12, and an output terminal 13.

$CMA_1$ is characterized by a current gain between its terminals 11 and 13 substantially equal to $-1$ times the transconductance of $Q_4$ divided by the transconductance of $Q_3$. (The relative transconductance of transistors with similar junction profiles, as well known, is determined by the ratio between the effective areas of their respective base-emitter junctions.) This current gain, usually made to be $-1$, in phase-splitters embodying the invention, by matching the effective base-emitter junction areas of $Q_3$ and $Q_4$ determines the ratio between the quiescent emitter currents of $Q_1$ and $Q_2$. Assuming $CMA_1$ to have such a current gain of $-1$ and $Q_1$ and $Q_2$ to have similar common-emitter current gains of $\beta$, the quiescent emitter currents of $Q_1$ and $Q_2$ are essentially equal, and the bias current from $S_1$ splits evenly between the base electrodes of $Q_1$ and $Q_2$ to support these quiescent emitter currents. If these quiescent emitter currents are assumed to have a normalized value of unity, $S_1$ supplied a bias current equal to $2/(\beta+1)$.

A source $S_2$ of signal current applies that signal current to the interconnection of the emitter electrode of $Q_1$ to input terminal 11 of $CMA_1$. This application is shown as being via capacitor $C_1$, but direct coupled arrangements for applying signal may be employed instead.

Signal from $S_2$ perturbs the quiescent current flow into the input terminal 11 of $CMA_1$ with normalized value of unity, by an amount $\Delta$. The $(1+\Delta)$ current into $CMA_1$ via terminal 11 gives rise to a current $(1+\Delta)$ into $CMA_1$ via terminal 13. This causes $Q_4$ to demand a corresponding output current $(1+\Delta)$ from $Q_2$, causing the base current demand of $Q_2$ to be $(1+\Delta)/(\beta+1)$. Subtracting the base current of $Q_2$ from the $2/(\beta+1)$ current supplied by $S_1$, leaves a base current of $(1-\Delta)/(\beta+1)$ for $Q_1$. The emitter current of $Q_1$ is thus $(1-\Delta)$, and current generator $S_1$ must supply a signal current of $2\Delta$ to support the assumed signal conditions. Consequently, the input impedance of the FIG. 1 phase-splitter configuration is one-half that of $CMA_1$ by itself. The input impedance of $CMA_1$ is substantially that afforded by self-biased transistor $Q_3$ known to have a value of one divided by 25 millimhos per milliampere of emitter current.

The collector electrodes of $Q_1$ and $Q_2$ are biased to condition them for normal transistor action; and the $(1+\Delta)$ and $(1-\Delta)$ emitter currents of transistors $Q_1$ and $Q_2$, respectively, are amplified by the common-base amplifier actions of these transistors to develop $\beta(1+\Delta)/(\beta+1)$ and $\beta(1-\Delta)/(\beta+1)$ respective collector currents. These collector currents with similar quiescent components and push-pull signal components provide the output signals of the FIG. 1 phase-splitter and may, as shown, be applied to resistive loads $R_1$ and $R_2$ to convert them from current to voltage form. The push-pull output signal voltages are then available at terminals 14 and 15.

It is important to the understanding of the present invention to appreciate that the interconnection between the base electrodes of $Q_1$ and $Q_2$ is a bidirectional coupling means permitting the exchange between them of the push-pull variations in their base currents responsive to input signal applied by $S_2$. It is this bidirectional coupling means, which may take other known forms, that removes the need for any other signal path to the base electrodes of $Q_1$ and $Q_2$ and facilitates using a constant current generator $S_1$ to supply quiescent base currents to $Q_1$ and $Q_2$. The current generator $S_1$ is made to have a relatively high source impedance which does not interfere with this exchange of base current variations between $Q_1$ and $Q_2$.

$\Delta$ may assume positive or negative values. $\Delta$ may exceed unity amplitude to obtain Class B phase-splitter operation if precautions are taken to clamp the base potentials of $Q_1$ and $Q_2$ under such large-swing conditions from swinging below about 1 volt. This, to avoid saturation of $Q_4$ and biasing of the collector of $Q_3$ below ground.

$CMA_1$ can be replaced with a common-emitter amplifier transistor such as $Q_4$ alone. This will cause the signal at terminal 14 to be smaller than that at terminal 15 by the current gain $\beta$ of $Q_4$, which can be compensated for by a subsequent amplifier. Alternatively, the $\beta$ of $Q_4$ can be reduced to unity amplitude by known manufacturing techniques—e.g., using large base widths and high base region doping levels as compared to conventional manufacture.

FIG. 2 shown a constant current generator of the type described in U.S. Pat. No. 3,891,935, which may be employed as the generator $S_1$ of the FIG. 1 phase-splitter. Transistors $Q_5$ and $Q_6$ are in Darlington cascade arrangement with a direct-coupled degenerative feedback connection of the collector electrode of $Q_6$ to the base electrode of $Q_5$. This feedback regulates the potential at the base electrode of $Q_5$ to the sum of the base-emitter offset potentials $V_{BEQ5}$ and $V_{BEQ6}$ of $Q_5$ and $Q_6$, respectively. In this regulation process, the collector current of $Q_5$ is adjusted to a value substantially equal to: $(+V_{CC}-V_{BEQ5}-V_{BEQ6})$, the potential drop across $R_3$, divided by the resistance $R_3$. The base current of $Q_5$, smaller by a factor $\beta$, is coupled by the common-base amplifier action of $Q_5$ to the input terminal 16 of a current mirror amplifier $CMA_2$ of complementary conductivity type of $Q_1, Q_2, Q_3, Q_4, Q_5, Q_6$. $CMA_2$ provides an oppositely directed current from its output terminal 18 for application to the joined base electrodes of $Q_1$ and $Q_2$. The supply provides a current inversely proportional to $\beta$, that substantially cancels out the effect of variation in the $\beta$ of $Q_1$ and $Q_2$ upon the potential drops across $R_1$ and $R_2$. If $CMA_2$ has a current gain of $-1$ between its terminals 16 and 18, making $R_3 = R_1 \approx R_2$ will bias terminals 14 and 15 one base-emitter potential offset above $+V_{CC}/2$. Emitter follower transistors can receive their input signals from terminals 14 and 15 to supply push-pull output signals superimposed on $+V_{CC}/2$, facilitating direct coupling to succeeding stages.

FIG. 3 illustrates a second embodiment of the invention. It includes the elements of FIG. 1 and, in addition: (a) $Q_1$ has another transistor $Q_{11}$ connected with it to form a current mirror amplifier $CMA_3$ with input, common and output terminals 31, 32 and 33, respectively, and (b) $Q_2$ has another transistor $Q_{12}$ connected with it to form a current mirror amplifier $CMA_4$ with input, common and output terminals 41, 42 and 43, respectively. While the current gains of $CMA_3$ and $CMA_4$ can be made $-1$ as between their respective input and output terminals, it is usually desirable to make these gains larger by factors approaching the $\beta$'s of their component transistors. This is done by making the effective areas of the base-emitter junctions of $Q_1$ and $Q_2$ larger than those of the base-emitter junctions of $Q_{11}$ and $Q_{12}$ by these factors connecting $Q_{11}$ and $Q_{12}$ to modify the effective current gains of $Q_1$ and $Q_2$ so as to be substantially independent of $\beta$ means that the constant current source $S_1'$ can supply $\beta$-independent bias current to the base electrodes of $Q_1$ and $Q_2$ without incurring $\beta$-related variations in the potential drops across $R_1$ and $R_2$. So, $S_1$ may simply consist of a resistance equal to $R_1$ and to $R_2$, connected between $+V_{CC}$ and the interconnection of terminals 21 and 31 to bias terminals 14 and 15 one base-emitter potential drop more positive than $+V_{CC}/2$, when the gains of $CMA_3$ and $CMA_4$ equal $-1$.

One skilled in the art of electronic circuit design will appreciate that many other variations of the present invention exist. The current mirror amplifier $CMA_1$ of the particular type shown can be replaced by other known types, for example. $CMA_3$ and $CMA_4$ can be replaced by different types of current mirror amplifier or by other current amplifiers with well-defined current gains. A great variety of output loads may replace $R_1$ and $R_2$ and the constant current generators $S_1$ and $S_1'$ may take other forms to suit those loads.

What is claimed is:

1. The combination of:
   a current mirror amplifier having an input terminal, an output terminal, and a common terminal, connected at its common terminal to a point at a reference potential;
   first and second loads;
   a terminal for an operating voltage;
   first and second transistors of the same conductivity type, each having base and emitter and collector electrodes;
   a connection of the emitter electrode of said first transistor to the input terminal of said current mirror amplifier;
   a connection of the collector electrode of said first transistor through said first load to said terminal for said operating voltage;
   a connection of the emitter electrode of said second transistor to the input terminal of said current mirror amplifier;
   a connection of the collector electrode of said second transistor through said second load to said terminal for said operating voltage;
   current generator means coupled to the base electrodes of said first and said second transistors for supplying them quiescent base currents;
   bidirectional coupling means between the base electrodes of said first and said second transistors for exchanging their respective base current variations between them; and
   means for applying an input signal to the connection of the emitter electrode of said first transistor and the input terminal of said current mirror amplifier.

2. The combination set forth in claim 1 wherein said bidirectional coupling means between the base electrodes of said first and said second transistors consists of a direct connection between the base electrodes of said first and said second transistors, the sole other connection to the base electrodes of said first and said second transistors being that of said current generator means.

3. The combination set forth in claim 2 wherein said current generator means provides a current inversely proportional to the common-emitter forward current gain of said first and said second transistors, thereby adjusting the quiescent collector currents of said first and second transistors to be substantially independent of the common-emitter forward current gains of said first and said second transistors.

4. The combination set forth in claim 1 having:
   third and fourth transistors of said same conductivity type, having respective base and emitter and collector electrodes, said third transistor being connected emitter-to-emitter with said first transistor and having its collector electrode direct coupled to an interconnection between the base electrodes of said first and said third transistors, said fourth transistor being connected emitter-to-emitter with said second transistor and having its collector electrode direct coupled to an interconnection between the base electrodes of said second and said fourth transistors.

5. A phase-splitter circuit comprising:
   a current mirror amplifier having input, common and output terminals;
   first and second transistors of the same conductivity type, each having base and emitter and collector electrodes;
   an interconnection of the emitter electrode of said first transistor and the input terminal of said current mirror amplifier for receiving an input signal;
   an interconnection of the emitter electrode of said second transistor to the output terminal of said current mirror amplifier;
   a constant current generator connected between the common terminal of said current mirror amplifier and an interconnection between the base electrodes of said first and said second transistors;
   means for biasing the collector electrodes of each of said first and second transistors relative to said common terminal to condition said first and second transistors for normal transistor action; and a pair of terminals to which the collector electrodes of said first and said second transistors are connected for supplying push-pull output signals responsive to said input signal.

6. In combination:

first, second and third current mirror amplifiers each having input, output and common terminals;

an interconnection of the input terminal of said first current mirror amplifier and the common terminal of said second current mirror amplifier, for receiving an input signal;

an interconnection of the output terminal of said first current mirror amplifier to the common terminal of said third current mirror amplifier; and a constant current generator connected between the common terminal of said first current mirror amplifier and an interconnection of the input terminals of said second and said third current mirror amplifiers, whereby push-pull output signals are afforded at the output terminal of said second and said third current amplifiers responsive to said input signal.

7. In combination:

first and second loads;

first and second terminals for application of operating potential therebetween;

first, second and third transistors of the same conductivity type, each having base and emitter and collector electrodes;

connections of the emitter electrodes of said first, said second, and said third transistors respectively to said third transistor base electrode, to said third transistor collector electrode, and to said first terminal;

connections of the collector electrodes of said first and said second transistors to said second terminal respectively through said first load and through said second load;

current generator means coupled to the base electrodes of said first and said second transistors for supplying them quiescent base currents;

bidirectional coupling means between the base electrodes of said first and said second transistors for exchanging their respective base current variations between them; and means for applying an input signal to the connecton of the emitter electrode of said first transistor to the base electrode of said third transistor.

* * * * *